US012598732B2

(12) United States Patent
Jiang et al.

(10) Patent No.: US 12,598,732 B2
(45) Date of Patent: Apr. 7, 2026

(54) SEMICONDUCTOR STRUCTURE AND METHOD FOR MANUFACTURING MEMORY

(71) Applicant: CHANGXIN MEMORY TECHNOLOGIES, INC., Hefei City (CN)

(72) Inventors: Yi Jiang, Hefei City (CN); Deyuan Xiao, Hefei City (CN); Xingsong Su, Hefei City (CN); Youming Liu, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 769 days.

(21) Appl. No.: 17/935,033

(22) Filed: Sep. 23, 2022

(65) Prior Publication Data

US 2023/0018716 A1    Jan. 19, 2023

Related U.S. Application Data

(63) Continuation of application No. PCT/CN2022/108202, filed on Jul. 27, 2022.

(30) Foreign Application Priority Data

May 30, 2022    (CN) .......................... 202210601020.9

(51) Int. Cl.
*H10B 12/00* (2023.01)
*G11C 5/06* (2006.01)

(52) U.S. Cl.
CPC ............. *H10B 12/30* (2023.02); *G11C 5/063* (2013.01); *H10B 12/03* (2023.02); *H10B 12/05* (2023.02); *H10B 12/482* (2023.02)

(58) Field of Classification Search
CPC ........ G11C 5/025; G11C 5/063; H10B 12/03; H10B 12/05; H10B 12/30; H10B 12/482; H10D 89/10
See application file for complete search history.

(56) References Cited

U.S. PATENT DOCUMENTS 11,094,699 B1    8/2021   Brewer
2019/0252386 A1   8/2019   Lee et al.

FOREIGN PATENT DOCUMENTS

CN           107623033 A       1/2018

*Primary Examiner* — Britt Hanley
*Assistant Examiner* — Kevin Quinto
(74) *Attorney, Agent, or Firm* — Syncoda LLC; Feng Ma

(57) ABSTRACT

A semiconductor structure includes a plurality memory group provided in rows, each of the memory groups includes a plurality of memories arranged at intervals along a row direction, and for two adjacent ones of the memory groups, the memories in one memory group and the memories in another memory group are staggered.

15 Claims, 24 Drawing Sheets

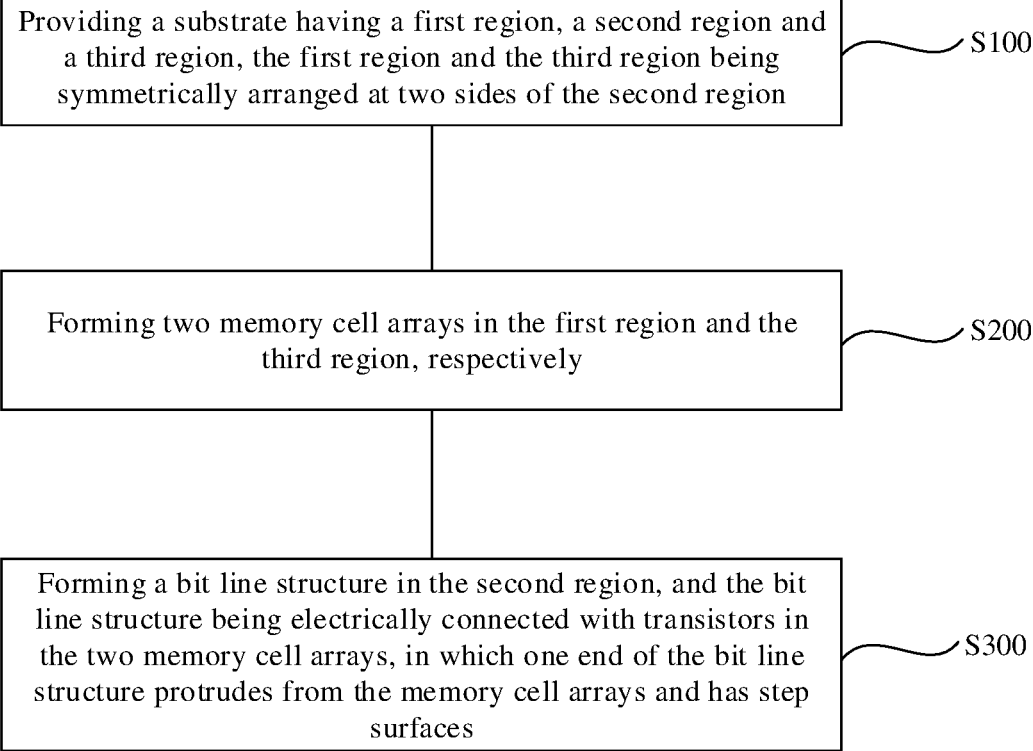

| Providing a substrate having a first region, a second region and a third region, the first region and the third region being symmetrically arranged at two sides of the second region | S100 |

| Forming two memory cell arrays in the first region and the third region, respectively | S200 |

| Forming a bit line structure in the second region, and the bit line structure being electrically connected with transistors in the two memory cell arrays, in which one end of the bit line structure protrudes from the memory cell arrays and has step surfaces | S300 |

FIG. 8

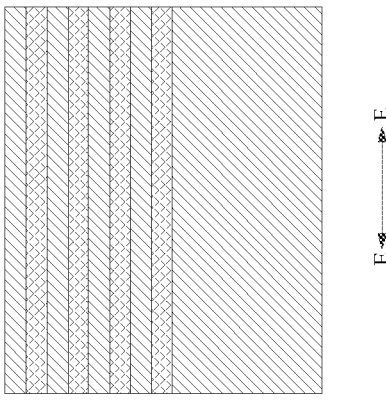
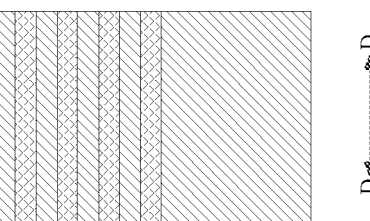
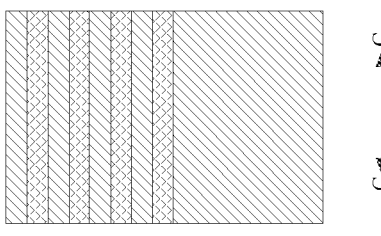
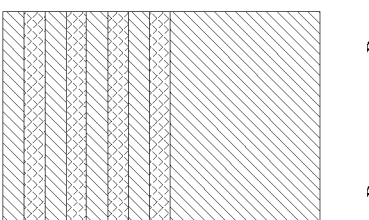
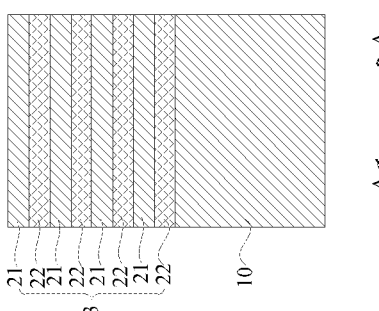
FIG. 9

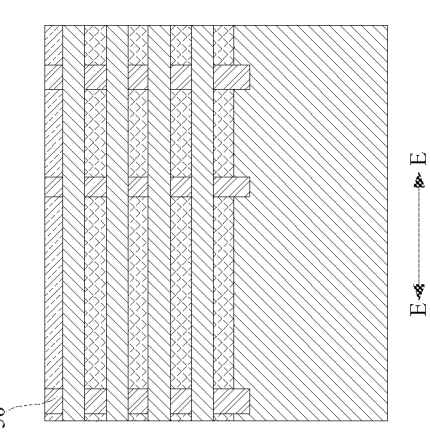
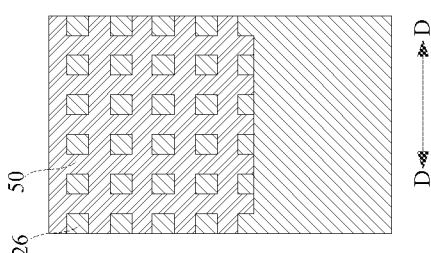
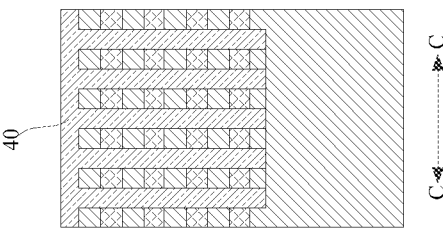
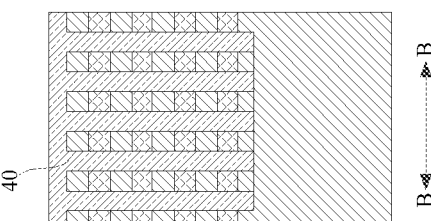
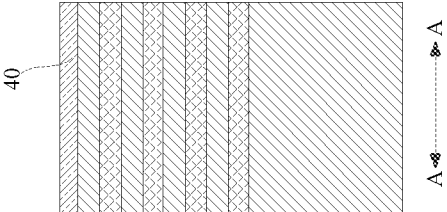
FIG. 14

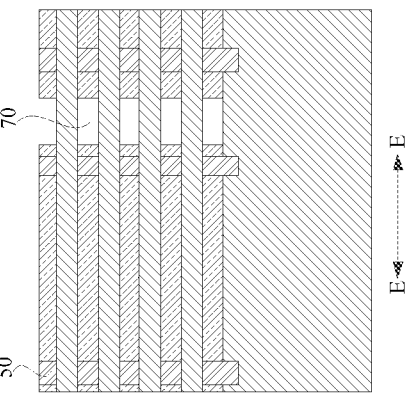
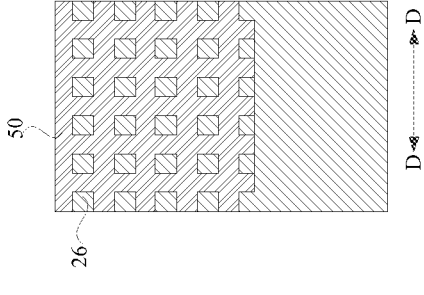
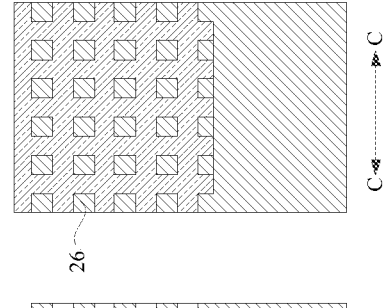
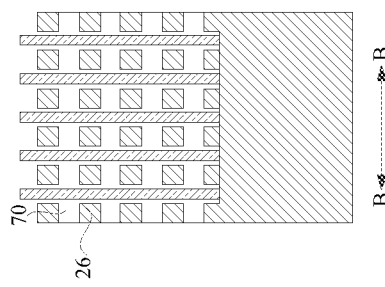
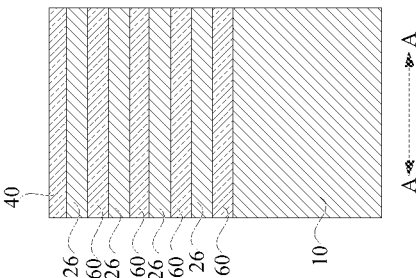
FIG. 16

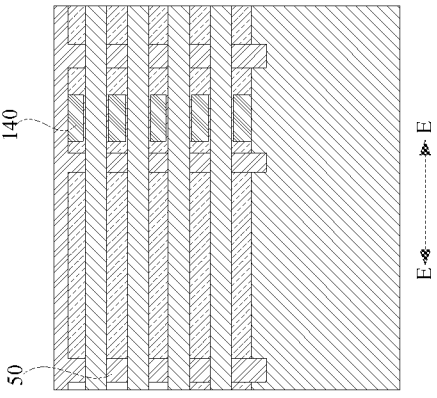
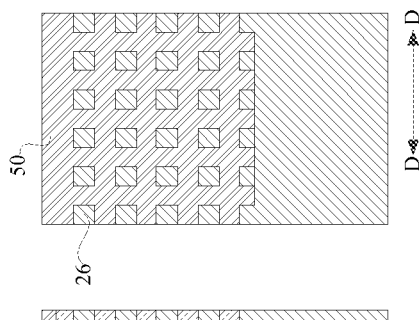
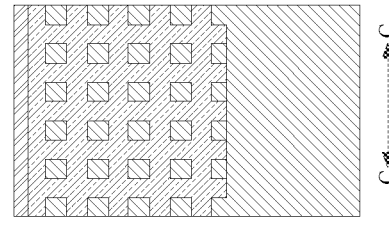
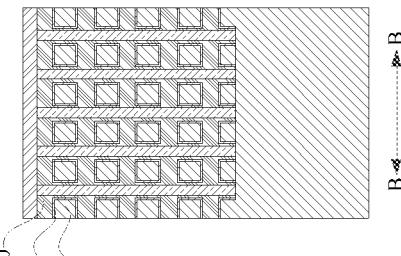
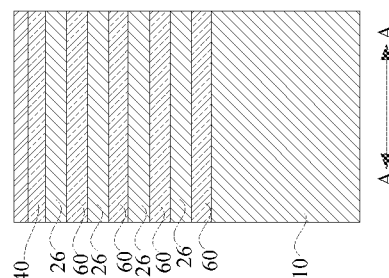
FIG. 17

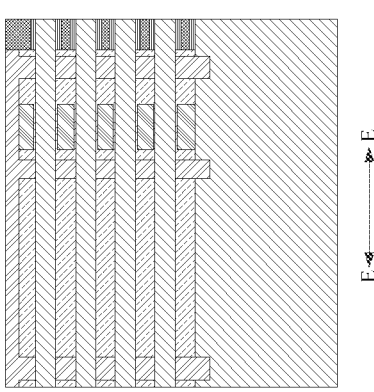
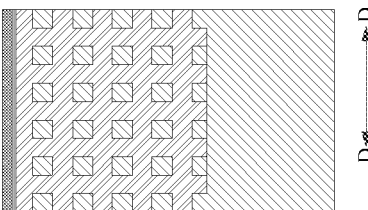
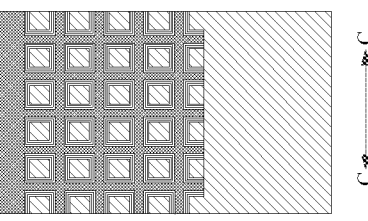
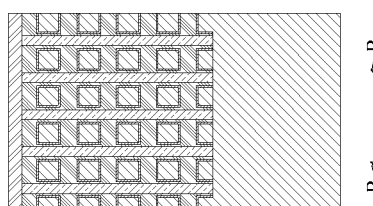
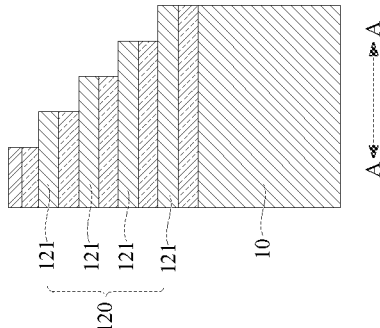
FIG. 21

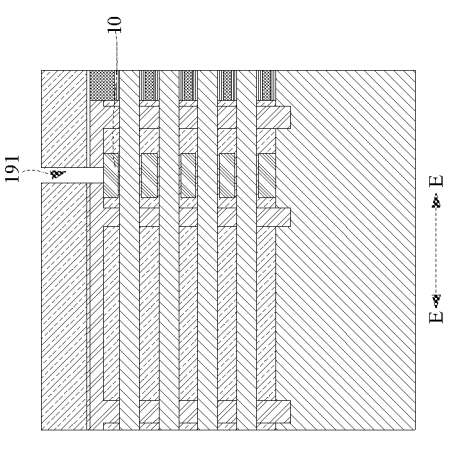
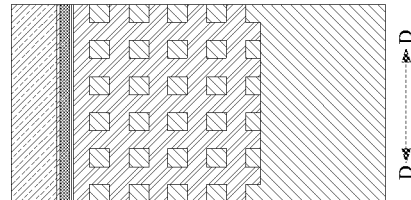
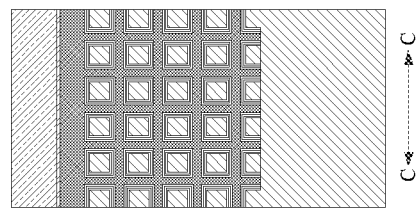
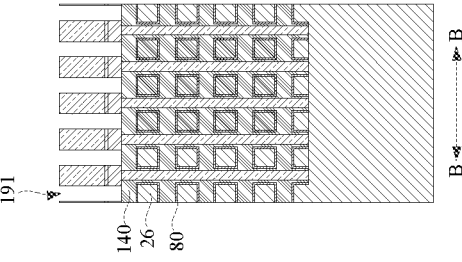
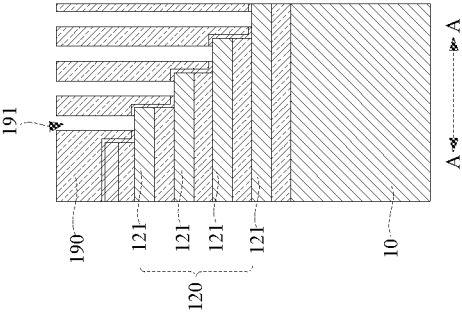
FIG. 23

1

SEMICONDUCTOR STRUCTURE AND METHOD FOR MANUFACTURING MEMORY

CROSS-REFERENCE TO RELATED APPLICATIONS

The present application is a U.S. continuation application of International Application No. PCT/CN2022/108202 filed on Jul. 27, 2022, which claims priority to Chinese Patent Application No. 202210601020.9 filed on May 30, 2022. The disclosures of the above-referenced applications are hereby incorporated by reference in their entirety.

BACKGROUND

A dynamic random access memory (DRAM) is a kind of semiconductor device which can randomly write and read data at high speed, and often widely used in data storage devices or apparatus. The dynamic random access memory consists of a plurality of repetitive memory cells, each of which typically includes a capacitor that stores data information and a transistor that controls the reading of the data information in the capacitor.

In order to improve the storage capacity of semiconductor structures, semiconductor structures have been developed from two-dimensions to three-dimensions, that is, the memory cells of a three-dimensional semiconductor structure is arranged in three dimensions. However, the above memory cells still have the defect that the arrangement mode is not compact, which reduces the integration level of the semiconductor structure.

SUMMARY

According to some embodiments, a first aspect of embodiments of the disclosure provides a semiconductor structure, which includes a plurality memory groups, and each memory group includes a plurality of memories arranged at intervals along a row direction, and for two adjacent ones of memory groups, the memories in one memory group and the memories in another memory group are staggered.

Each of the memories includes two memory cell arrays and a bit line structure, and the two memory cell arrays are located at opposite sides of the bit line structure in the row direction.

The bit line structure extends along a first direction and is electrically connected with transistors in the two memory cell arrays, in which one end of the bit line structure protrudes from the memory cell arrays and the end has step surfaces, and the protruding part of the bit line structure is located between adjacent memories in the memory group adjacent to the protruding part; the first direction and the row direction are perpendicular to each other and are located in a same horizontal plane.

According to some embodiments, a second aspect of the embodiments of the disclosure provides a method for manufacturing a memory to manufacture a memory in the semiconductor structure provided in the first aspect, which includes the following operations.

A substrate is provided which has a first region, a second region and a third region; and the first region and the third region are symmetrically arranged at two sides of the second region;

Two memory cell arrays are formed in the first region and the third region, respectively;

A bit line structure is formed in the second region, and the bit line structure is electrically connected with transistors in the two memory cell arrays, in which one end of the bit line structure protrudes from the memory cell arrays and has step surfaces.

BRIEF DESCRIPTION OF THE DRAWINGS

In order to more clearly illustrate the embodiments of the disclosure or the technical solution in some implementations, a brief description of the drawings required for use in the embodiments or some implementations description will be provided below. Apparently, the accompanying drawings in the following description are some embodiments of the disclosure. For a person of ordinary skilled in the art, other drawings can be further obtained based on these drawings without creative work.

FIG. 8 is process flow diagram of a method for manufacturing a memory in embodiments of the disclosure;

FIG. 9 shows cross-sectional views in A-A, B-B, C-C, D-D and E-E directions after forming an initial stacked structure in the method for manufacturing a memory provided by embodiments of the disclosure;

FIG. 14 shows cross-sectional views in A-A, B-B, C-C, D-D and E-E directions after forming a support structure in the method for manufacturing a memory provided by embodiments of the disclosure;

FIG. 16 shows cross-sectional views in A-A, B-B, C-C, D-D, and E-E directions after forming a filling region in the method for manufacturing a memory provided by embodiments of the disclosure;

FIG. 17 shows cross-sectional views in A-A, B-B, C-C, D-D, and E-E directions after forming a gate oxide layer and word lines in the method for manufacturing a memory provided by embodiments of the disclosure;

FIG. 21 shows cross-sectional views in A-A, B-B, C-C, D-D and E-E directions after forming a bit line structure in the method for manufacturing a memory provided by embodiments of the disclosure;

FIG. 23 shows cross-sectional views in A-A, B-B, C-C, D-D, and E-E directions after forming filling holes in the method for manufacturing a memory provided by embodiments of the disclosure.

DETAILED DESCRIPTION

The disclosure relates to the technical field of semiconductor, in particular to a semiconductor structure and a method for manufacturing a memory.

As described in the background, the three-dimensional semiconductor structure in some implementations has the defect of low integration, the inventor's research found that the reason for this problem is that when the memories are arranged according to a regular rectangular array, in order to avoid interference between adjacent bit line structures, the distance between two adjacent ones of the memories is usually increased, thus reducing the integration of semiconductor structures.

for the above technical problems, embodiments of the disclosure provide a semiconductor structure and the method for manufacturing a memory. In two adjacent ones of the rows of a memory group, the memories in one memory group row and the memories in the other memory group row are arranged at intervals, and the protruding part of a bit line structure is located between adjacent memories in the memory group adjacent to the bit line structure, so that the space between adjacent memories can be reasonably utilized, the number of memories per unit area can be increased, and the integration of the semiconductor structure can be improved.

In addition, in the embodiments, two memory cell arrays are further integrated together, and the two memory cell arrays share one bit line structure, so that the volume of the memory can be reduced and the integration of the semiconductor structure can be improved.

In order to explain the above objects, features and advantages of the embodiment of the present disclosure more obvious and understandable, a clear and complete description of the technical solutions of the embodiments of the disclosure will be provided below with reference to the accompanying drawings in the embodiments of the disclosure. It is apparent that the described embodiments are only a part of the embodiments of the disclosure, not all of them. Based on the embodiments in the disclosure, any other embodiments obtained by those of ordinary skill in the art without making creative effort falls within the scope of protection of the disclosure.

The embodiments do not limit the semiconductor structure, and the semiconductor structure will be described below taking a dynamic random access memory (DRAM) as an example, but the embodiments are not limited thereto, and the semiconductor structure in the embodiments may be other structures.

Figure 1:
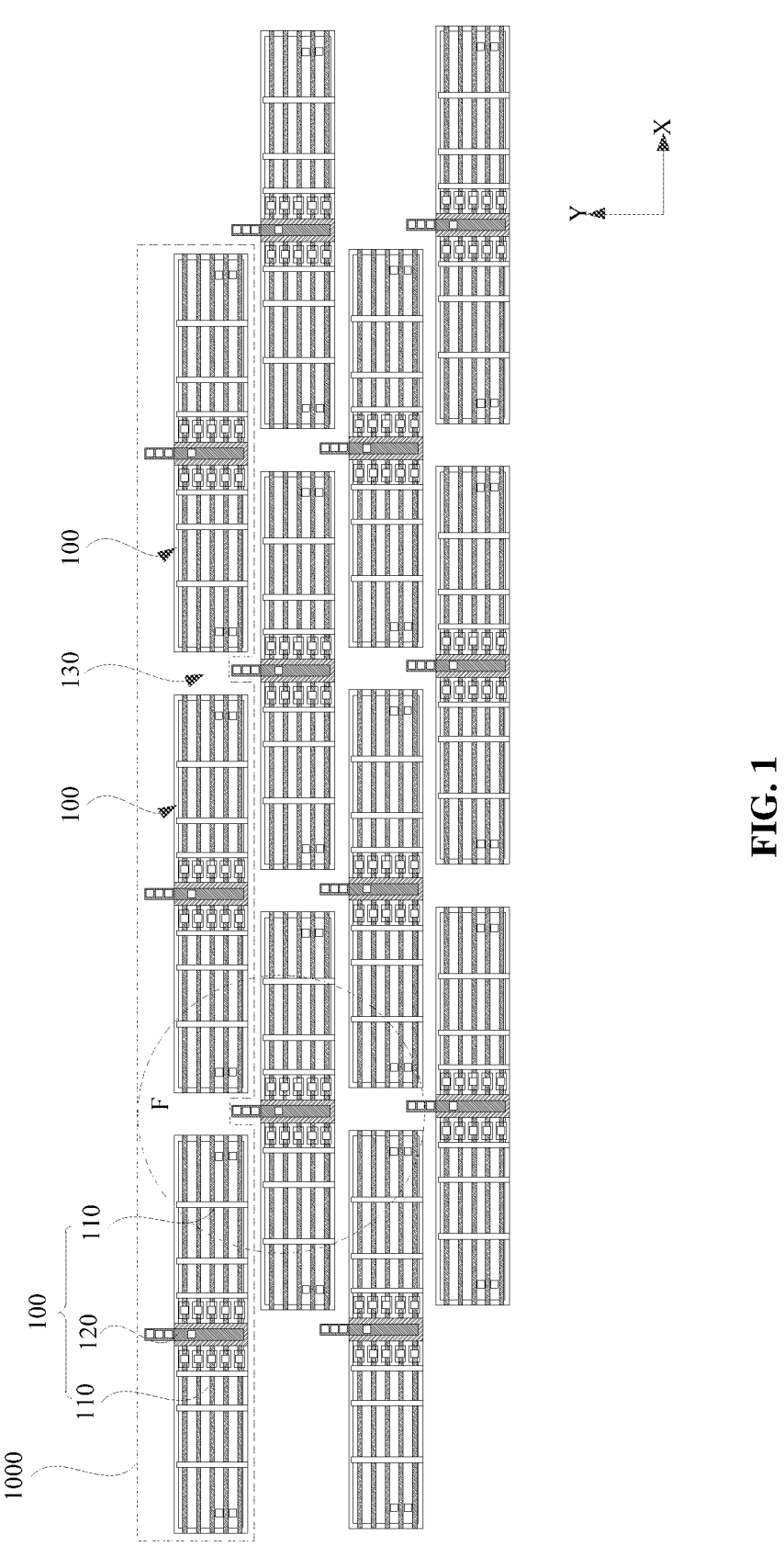
FIG. 1 is a schematic diagram 1 of a semiconductor structure provided by embodiments of the disclosure.

Referring to FIG. 1 to FIG. 7, embodiments of the disclosure provide a semiconductor structure including a plurality of memory groups 1000 provided in rows, in which one memory group 1000 includes components within the dashed line frame of FIG. 1.

Figure 2:
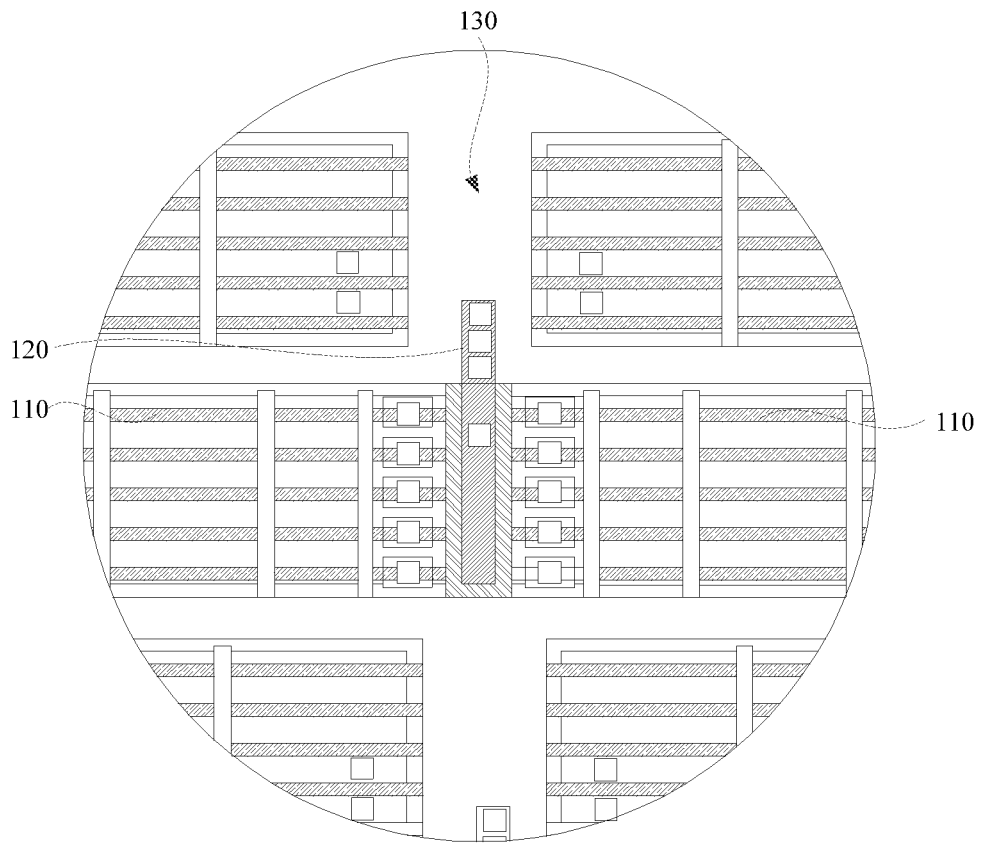
FIG. 2 is an enlarged schematic view of region F in FIG. 1.

Referring to FIG. 2, each memory group 1000 includes a plurality of memories 100 arranged at intervals in a row direction such that gaps 130 is provided between adjacent memories 100. Herein, the row direction may refer to the X direction in FIG. 1.

It should be noted that in the same memory group 1000, the gaps 130 between adjacent memories 100 may be equal or not equal, which is not specifically limited here by the embodiment.

In two adjacent ones of the memory groups 1000, the memories 100 in one memory group 1000 and the memories 100 in the other memory group 1000 are staggered.

Taking the semiconductor structure shown in FIG. 1 as an example, the semiconductor structure includes four memory groups 1000 provided in rows. For convenience of description below, from up to down or along the Y direction, the uppermost row is referred to as the first row, accordingly, the lowermost row is referred to as the fourth row.

As can be seen from the above, in this embodiment, odd-numbered memory groups 1000 and even-numbered memory groups 1000 are staggered, so that the odd-numbered memory groups 1000 are aligned in a column direction, and the even-numbered memory groups 1000 are aligned in the column direction. By doing so, the arrangement of the memory groups 1000 is more compact, so that more memory groups 1000 can be provided in a unit area, and the density of the memory groups 1000 in the semiconductor structure is increased, thereby improving the integration of the semiconductor structure. It can be understood that the column direction may be the Y direction in FIG. 1.

Each of the memories 100 includes two memory cell arrays 110 and a bit line structure 120, and the two memory cell arrays 110 are located at opposite sides of the bit line structure 120 in the row direction X; in other words, the memory cell array 110, the bit line structure 120, and the memory cell array 110 are arranged in sequence in the row direction X.

The bit line structure 120 extends in a first direction perpendicular to the row direction, and the first direction and the row direction are located in a same horizontal plane. For example, the first direction may be understood as the column direction.

The bit line structure 120 is electrically connected to transistors in the two memory cell arrays 110 to write data into the memory cell arrays 110 through the bit line structure 120 or to read data from the memory cell arrays 110 through the bit line structure 120.

One end of the bit line structure 120 protrudes from the memory cell arrays 110 and has a step-shape, so as to facilitate the subsequent connection of data lines with the bit line structure 120. The protruding part of the bit line structure 120 is located between adjacent memories 100 in a memory group 1000 adjacent to the protruding part. Taking the orientation of FIG. 1 as an example, the protruding part of the bit line structure 120 of a first memory 100 in a second memory group 1000 is located in the gap 130 between a first memory 100 and a second memory 100 in a first memory group 1000.

In the semiconductor structure of the embodiments of the disclosure, for two adjacent ones of the memory groups 1000, the memories 100 in one memory group 1000 and the memories 100 in the other memory group 1000 are staggered, and the protruding part of the bit line structure 120 is located between adjacent memories 100 in the memory group adjacent to the protruding part. By doing so, the space between adjacent memories 100 can be reasonably utilized, the number of memories 100 per unit area can be increased, and the integration of the semiconductor structure can be improved.

In addition, in this embodiment, two memory cell arrays 110 are integrated together, and the two memory cell arrays 110 share one bit line structure. By doing so, the volume of the memory 100 can be reduced and the integration of the semiconductor structure can be improved.

Figure 3:
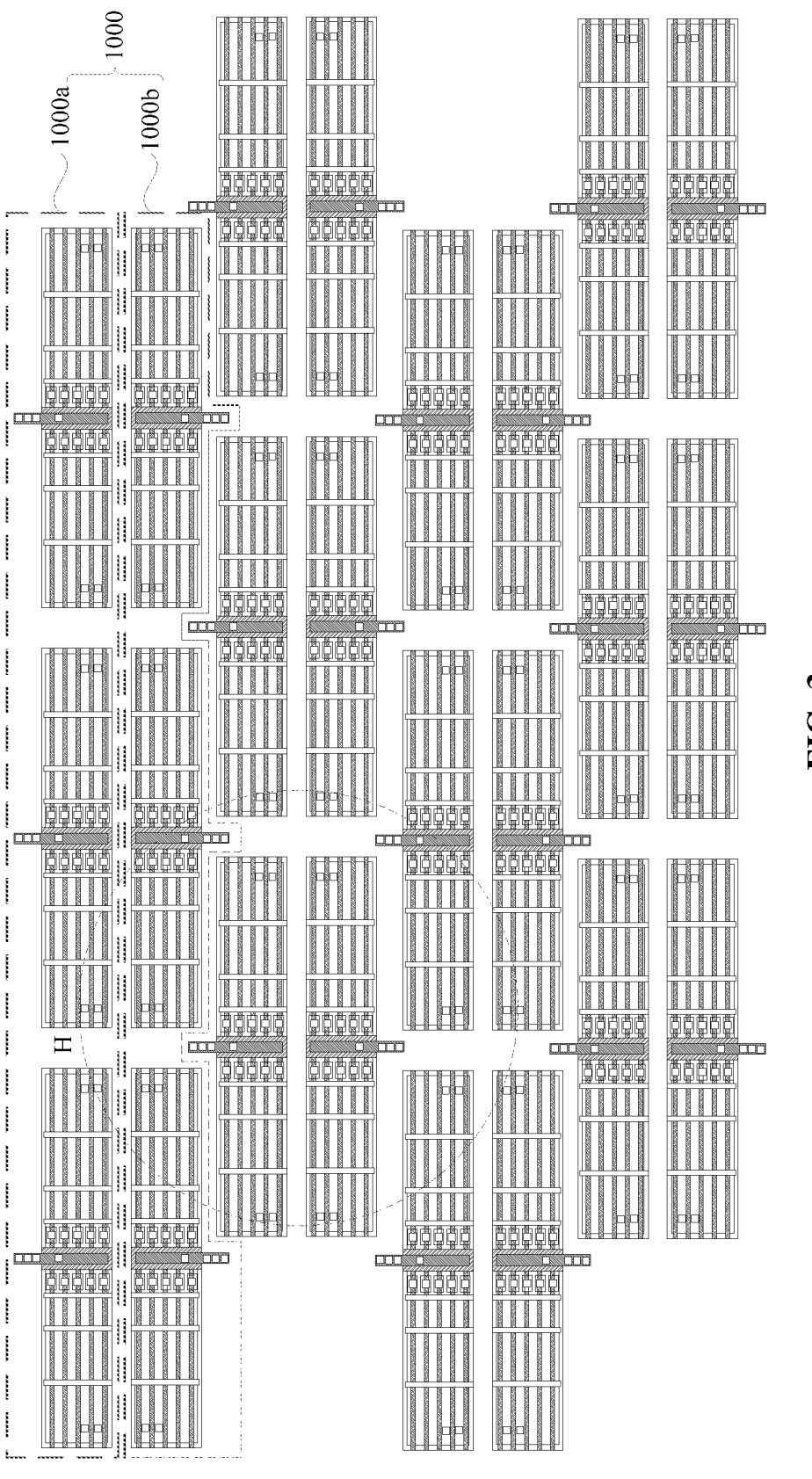
FIG. 3 is a schematic diagram 2 of a semiconductor structure provided by embodiments of the disclosure.
Figure 4:
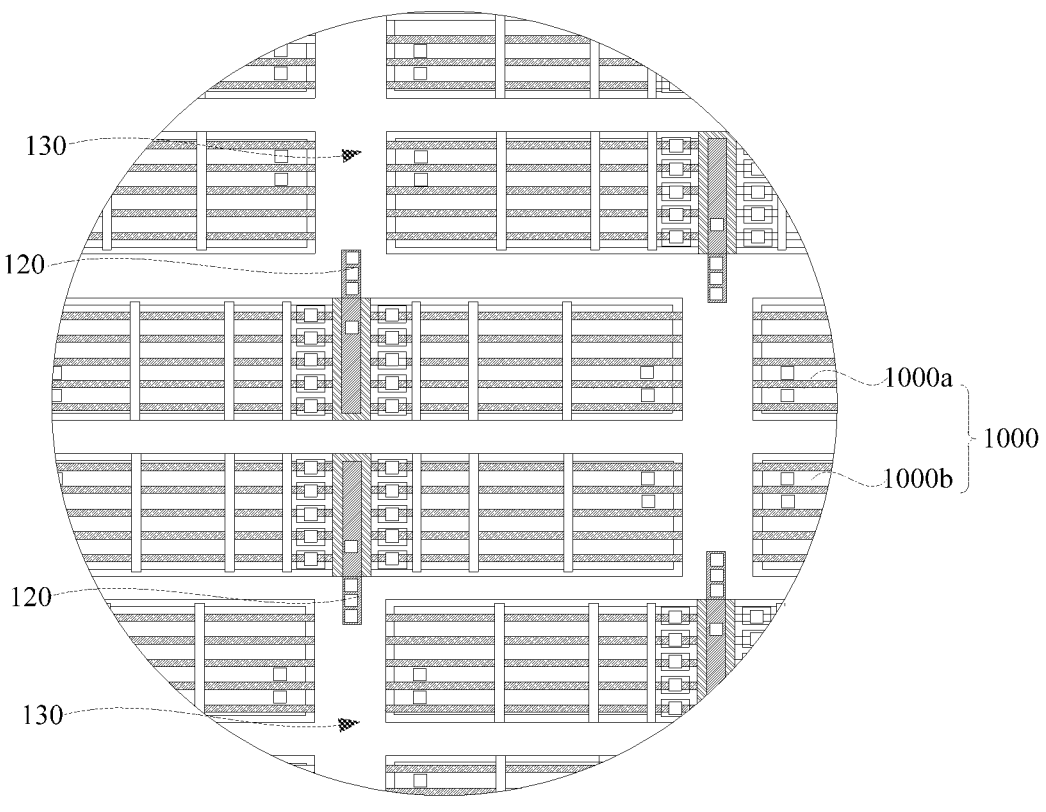
FIG. 4 is an enlarged schematic view of region H in FIG. 3.

In some embodiments, referring to FIG. 3 and FIG. 4, each memory group 1000 includes a first sub-memory group 1000a and a second sub-memory group 1000b, the first sub-memory group 1000a and the second sub-memory group 1000b are arranged at intervals along a first direction, and the first sub-memory group 1000a and the second sub-memory group 1000b are arranged symmetrically with respect to the row direction.

For convenience of understanding, the first sub-memory group 1000a has components within the first dashed line frame in FIG. 3, and the second sub-memory group 1000b has components within the second dashed line frame in FIG. 3.

The first sub-memory group 1000a and the second sub-memory group 1000b are arranged at intervals along the first direction Y, and are arranged symmetrically with respect to the row direction X; that is, the protruding part of the bit line structure 120 of the first sub-memory group 1000a and the protruding part of the bit line structure 120 of the second sub-memory group 1000b have opposite directions.

Taking the orientation of FIG. 3 as an example, the protruding part of the bit line structure 120 in a first sub-memory group 1000a in the second row of the memory group 1000 is located in a gap between adjacent memories 100 in the first row of the memory group 1000, and the protruding part of the bit line structure 120 in a second sub-memory group 1000b in the second row of the memory group 100 is located in a gap between adjacent memories 100 in the third row of the memory group 1000. In this way, more memory groups 1000 can be provided in a unit area to increase the integration of the semiconductor structure.

Figure 5:
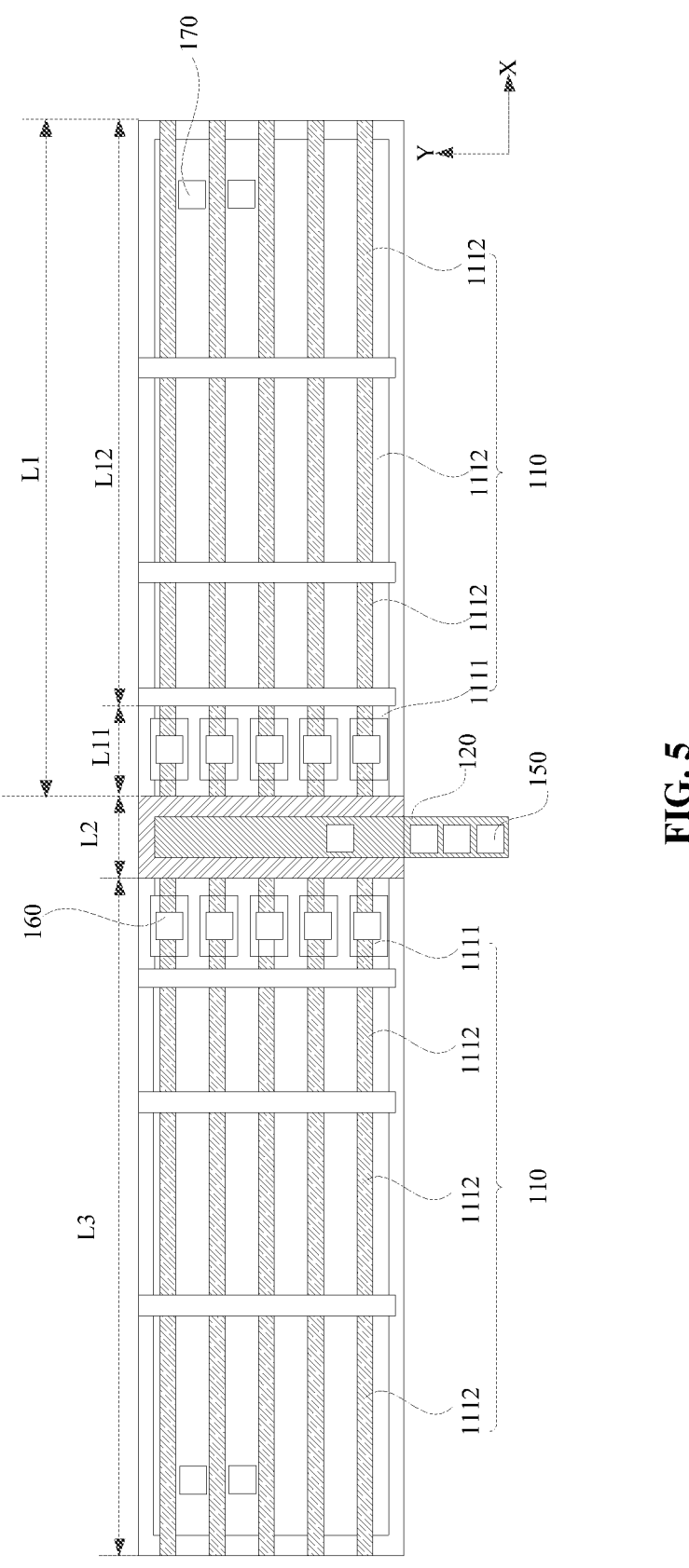
FIG. 5 is a schematic structural diagram of a memory provided by embodiments of the disclosure.
Figure 7:
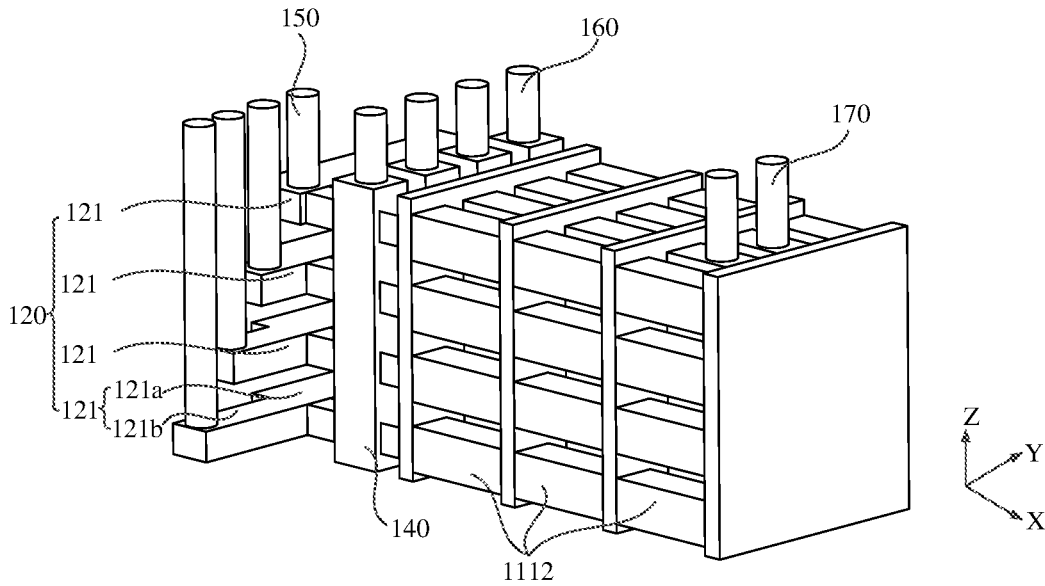
FIG. 7 is a partial three-dimensional diagram of a memory provided by embodiments of the disclosure.

In some embodiments, referring to FIG. 5 and FIG. 7, the memory cell array 110 includes a plurality of memory cell layers arranged at intervals in the second direction. The second direction, the first direction and the row direction are perpendicular to each other; that is, the second direction is the Z direction in FIG. 7. It should be understood that the memory cell layers can understand as the structure in FIG. 5.

For two adjacent ones of the memory cell layers, the projection of one memory cell layer on the other memory cell layer coincides with the other memory cell layer; that is, the plurality of memory cell layers are ensured to be aligned in a direction perpendicular to the paper surface, so as to facilitate the subsequent arrangement of the word line structure.

Each memory cell layer includes a plurality of memory cells 111 arranged at intervals along the first direction, in which each memory cell 111 includes a transistor 1111 and a capacitor 1112 connected to the transistor 1111, such that each memory cell extends in a horizontal direction. By doing so, a plurality of stacked memory cell layers can be formed under the same equivalent area, thereby increasing the storage capacity of the memory, thus improving the storage capacity of the semiconductor structure.

Herein, the transistor 1111 may be a gate all-around (GAA) field effect transistor, which may include a source, a drain, and a gate between the source and the drain, and the gate can be used to control the on-off of current between the source and the drain.

The capacitor 1112 may be connected to one of the source and the drain of the transistor 1111. For example, the capacitor 1112 may be connected to the source of the transistor 1111, and accordingly the bit line structure 120 may be connected to the drain of the transistor 1111.

In a possible embodiment, there are a plurality of capacitors 1112, the plurality of capacitors 1112 are arranged at intervals in the row direction, and adjacent capacitors 1112 are connected by a support. In this way, the storage capacity of a single memory can be increased, thereby improving the storage capacity of the semiconductor structure.

The plurality of capacitors 1112 are connected to each other by one electrode layer. In this way, the plurality of capacitors 1112 can be connected in parallel, so that the capacitance of the semiconductor structure is equal to the sum of the capacitance of all the capacitors, and the total current after the capacitors are connected in parallel is equal to the sum of the currents of each capacitor, thus the storage capacity of the semiconductor structure can be increased, and the performance of the semiconductor structure can be improved.

In some embodiments, with continued reference to FIG. 7, the bit line structure 120 includes a plurality of bit lines 121 arranged at intervals along the second direction, one bit line 121 is connected to the transistors 1111 of all the memory cells 111 in corresponding memory cell layer, and the number of the bit lines 121 is arranged in one-to-one correspondence with the number of memory cell layers, that is, each bit line 121 is connected to the corresponding memory cell layer on the same horizontal plane. For example, one bit line 121 is used to connect the first layer of the memory cell layers in the two memory cell arrays 110.

An end of the transistor connected to the bit line 121 is different from an end connected to the capacitor 1112. For example, when the bit line 121 is connected to the source of the transistor, the capacitor 1112 is connected to the drain of the transistor; as another example, when the bit line 121 is connected to the drain of the transistor, the capacitor 1112 is connected to the source of the transistor.

In the first direction, each of the bit lines 121 has a first surface and a second surface arranged oppositely. Taking the orientation shown in FIG. 6 and FIG. 7 as an example, the first surface may be a rear surface of the bit line 121 and the second surface may be a front surface of the bit line 121.

Either the first surfaces of the bit lines 121 or the second surfaces of the bit lines 121 are aligned, and the rest forms steps sequentially from a top to a bottom along the second direction. In an example, the first surfaces of all the bit lines 121 are aligned, and the second surfaces of all the bit lines 121 are not aligned and the lengths of the bit lines are sequentially increased from the top to the bottom, so that the second surfaces of all the bit lines 121 form a step-shape. In another example, the first surfaces of all the bit lines 121 are not aligned, and the second surfaces of all the bit lines 121 are aligned, so that the first surfaces of all the bit lines 121 forms a step-shape, thereby facilitating the preparation of data lines connected to the respective bit lines while increasing the space between the bit lines to prevent the interference of transmission signals. In addition, the parasitic capacitance between the upper and lower bit lines can also be reduced, and the performance of the semiconductor structure can be improved.

The width of the bit line 121 may be consistent everywhere or may not be consistent. For example, with continued reference to FIG. 7, each of the bit lines 121 other than the uppermost bit line includes a first segment 121a and a second segment 121b connected in sequence, and the width of the second segment 121b is shorter than the width of the first segment 121a.

Taking the orientation shown in FIG. 7 as an example, there are four bit lines 121 from the top to the bottom. The width of the first bit line 121 is the same everywhere, and the width is not consistent for each of the second bit line 121, the third bit line 121 and the fourth bit line 121, each of them includes a first segment 121a and a second segment 121b, and the width of the second segment 121b is shorter than that of the first segment 121a; and at least part of the second segment 121b is located between adjacent memories 100 in the memory group 1000 adjacent thereto.

In the embodiments, the widths of the partial second bit line 121, the partial third bit line 121, and the partial fourth bit line 121 are reduced, if the gap 130 between adjacent memories 100 in the same row can be further reduced to make better use of space, more memories can be provided in a unit area and the integration of the semiconductor structure is improved.

In addition, the width of the first segment 121a may be the same as the width of the first bit line 121, thereby ensuring that a bit line structure with a uniform width is formed in the same manufacture process.

In some embodiments, with continued reference to FIG. 7, the memory 100 further includes a word line structure including a plurality of word lines 140 arranged at intervals along the first direction, and each word line 140 extends along the second direction for connecting gates of all the memory cells 111 in the same second direction.

A voltage is applied to the gates of the memory cell 111 through the word line 140 to control the on-off of the source and the drain of the memory cell 111.

In some embodiments, with continued reference to FIG. 7, the memory 100 includes first data lines 150, second data lines 160 and a third data line 170. The first data lines 150 are connected to the bit line structure 120, the second data line 160 is connected to the word line 140, an electrical signal is supplied to the word line 140 through the second data line 160, and the third data line 170 is connected to the capacitor of the memory 100 such that the capacitor of the memory 100 is grounded.

Herein, there are a plurality of first data lines 150 and there are a plurality of second data lines 160. The first data lines 150 and the bit lines 121 are arranged in one-to-one correspondence, that is, one first data line 150 is connected to one bit line 121, and each first data line 150 is connected with the corresponding bit line 121 at a step surface formed by the adjacent bit line 121.

Taking the orientation shown in FIG. 7 as an example, the first one of the first data lines 150 is connected to the upper surface of the first bit line 121; the second one of the first data lines 150 is connected to the second bit line 121, and the connection position is the step formed by the first bit line 121 and the second bit line 121. By analogy, the third one of the first data lines 150 is connected to the third bit line 121, and the connection position is the step formed by the second bit line 121 and the third bit line 121; and the fourth one of the first data lines 150 is connected to the fourth bit line 121, and the connection position is the step formed by the third bit line 121 and the fourth bit line 121.

In this way, it can be convenient to connect each first data line 150 to the corresponding bit line 121, thereby facilitating the manufacture of each first data lines 150.

The second data lines 160 and the word lines 140 are arranged in one-to-one correspondence, that is, one second data line 160 is connected to one word line 140 to realize independent control of the word lines 140.

Figure 6:
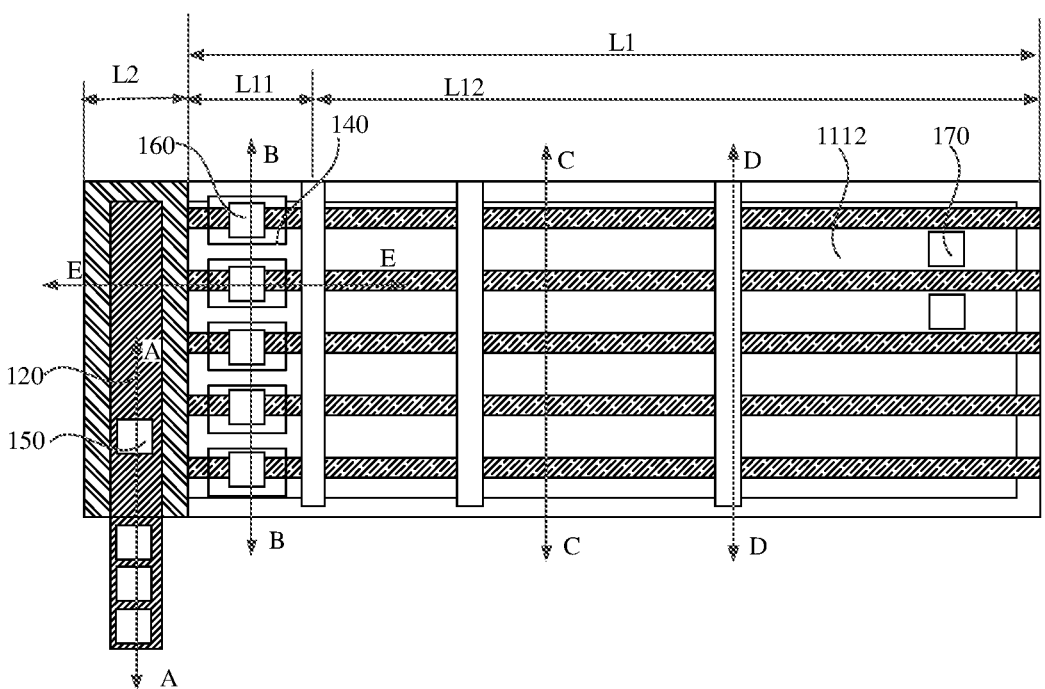
FIG. 6 is a schematic diagram of a partial structure of a memory provided by embodiments of the disclosure.

Referring to FIG. 8, the embodiments of the disclosure also provide a method for manufacturing a memory to manufacture the memory in the above embodiments. The schematic diagrams of the memory cell arrays and the bit line structure in the memory can continue with reference to FIG. 6 and FIG. 7. In order to facilitate the subsequent detailed description of each operation in the manufacture process of the memory and the simplification of the drawings, cross-sectional views at different positions in FIG. 6 are used for illustration below. Specifically, the cross section at A-A is a cross section parallel to the extension direction of the bit line structure 120 and located in a second region L2; the cross section at B-B is a cross section parallel to the extension direction of the bit line structure 120 and located in an adjacent first sub-region L11; the cross section at C-C is a cross section parallel to the extension direction of the bit line structure 120 and located at the capacitor 1112 in a second sub-region L12; the cross section at D-D is a cross section parallel to the extension direction of the bit line structure 120 and located between adjacent capacitors 1112 in the second sub-region L12; the cross section at E-E is a cross section perpendicular to the extension direction of the bit line structure 120 and located at the active layer.

The manufacturing method mainly includes the following operations.

In S100, a substrate is provided. The substrate has a first region, a second region and a third region, and the first region and the third region are symmetrically arranged at both sides of the second region.

Referring to FIG. 6 and FIG. 9, the substrate 10 provides support for film layers thereon. Herein, the substrate 10 includes a first region a second region and a third region; the first region and the third region are symmetrically arranged on both sides of the second region; that is, the first region, the second region and the third region are connected in sequence.

For describing the first region, the second region and the third region clearly, the region L1 in FIG. 5 may be defined as the first region, the region L2 in FIG. 5 as the second region, and the region L3 in FIG. 5 as the third region.

In the embodiments, the substrate 10 may be a semiconductor substrate. Exemplarily, the substrate 10 may be a silicon substrate, a germanium substrate, a silicon carbide (SiC) substrate, a silicon germanium (SiGe) substrate, a germanium on insulator (GOI) substrate or a silicon on insulator (SOI) substrate, and the like.

In S200, memory cell arrays are formed in the first region and the third region, respectively.

In S300, a bit line structure is formed in the second region, and the bit line structure is electrically connected with transistors in two memory cell arrays, in which one end of the bit line structure protrudes from the memory cell arrays and has step surfaces.

In this embodiment, two memory cell arrays share one bit line structure, the volume of the memory can be reduced and the integration of the semiconductor structure can be improved, as compared with the technical solution that one memory cell array and one bit line structure constitute a memory in some implementations.

In some embodiments, in order to further refine the placement of the transistors and the capacitors in the memory cell arrays, the first region and the third region are divided into a first sub-region and a second sub-region connected to each other, in which the first sub-region is denoted as L11 and the second sub-region is denoted as L12, the distribution of which is further referred to in FIG. 6. The operation of forming the memory cell arrays in the first region and the third region respectively includes the following operations.

Figure 10:
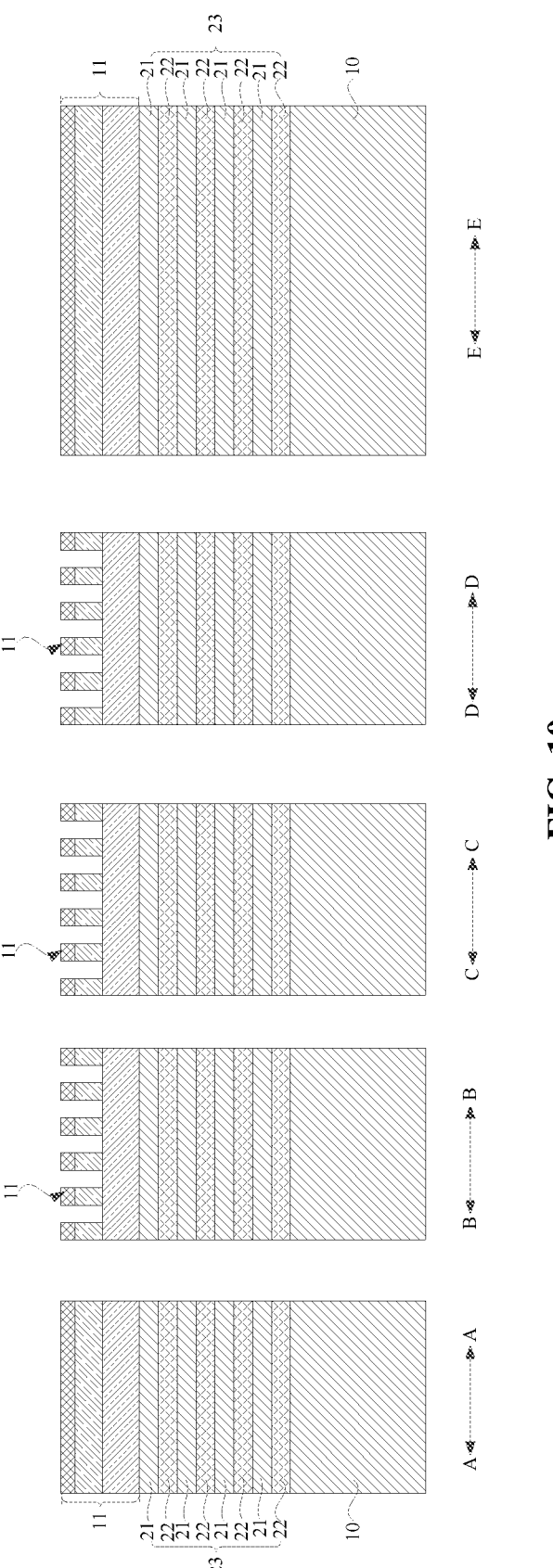
FIG. 10 shows cross-sectional views in A-A, B-B, C-C, D-D and E-E directions after forming a first mask layer in a method for manufacturing the memory provided by embodiments of the disclosure.

Referring to FIG. 10, in S210, columns of stacked structures arranged at intervals along the first direction are formed in the first region and the third region, and a first trench is provided between two adjacent ones of the columns of the stacked structures; and a laminated structure is formed in the second region, in which each of columns of the stacked structures includes a plurality of sacrificial layers and a plurality of active layers alternately stacked, and film layers of the laminated structure are the same as film layers of the stacked structure, the structure of which is shown in FIG. 10.

For example, referring to FIG. 9, an initial laminated structure 23 is formed on the substrate 10, the initial laminated structure 23 includes initial active layers 21 and first initial sacrificial layers 22 which are stacked and alternately arranged. That is, a plurality of initial active layers 21 and a plurality of first initial sacrificial layers 22 are formed on the substrate 10, the plurality of initial active layers 21 and the plurality of first initial sacrificial layers 22 are stacked in sequence and alternately arranged in a direction perpendicular to the substrate 10, and the first initial sacrificial layers 22 are disposed on the substrate 10. Herein, the number of the initial active layers 21 and the first initial sacrificial layers 22 may be set according to actual needs.

It should be noted that the structure of other sectional views in FIG. 9 is the same as that of the sectional view in A-A direction in FIG. 9. Therefore, other sectional views are not illustrated with reference numerals in order to simplify the drawings and facilitate viewing.

In some possible implementations, the initial active layers 21 and the first initial sacrificial layer 22 may be formed by deposition. Herein, the deposition process may be chemical vapor deposition (CVD), physical vapor deposition (PVD) or atomic layer deposition (ALD), or the like.

In other possible implementations, the first initial sacrificial layer 22 is formed by epitaxy (EPI). By doing so, a lattice mismatch between the first initial sacrificial layer 22 and the initial active layer 21 can be avoided. The material of the first initial sacrificial layer 22 includes silicon germanium, so that there is a larger etching selection ratio between the first initial sacrificial layer 22 and the initial active layer 21, which facilitates the subsequent process to selectively remove the sacrificial layer and reduce the etching of the initial active layer.

In addition, the first initial sacrificial layer 22, to some extent, supports the initial active layer 21, which ensures the manufacture process of the semiconductor structure.

Next, a first mask layer 11 having a mask pattern is formed on the initial active layer 21, in which the mask pattern is located at the first region and the third region.

Figure 11:
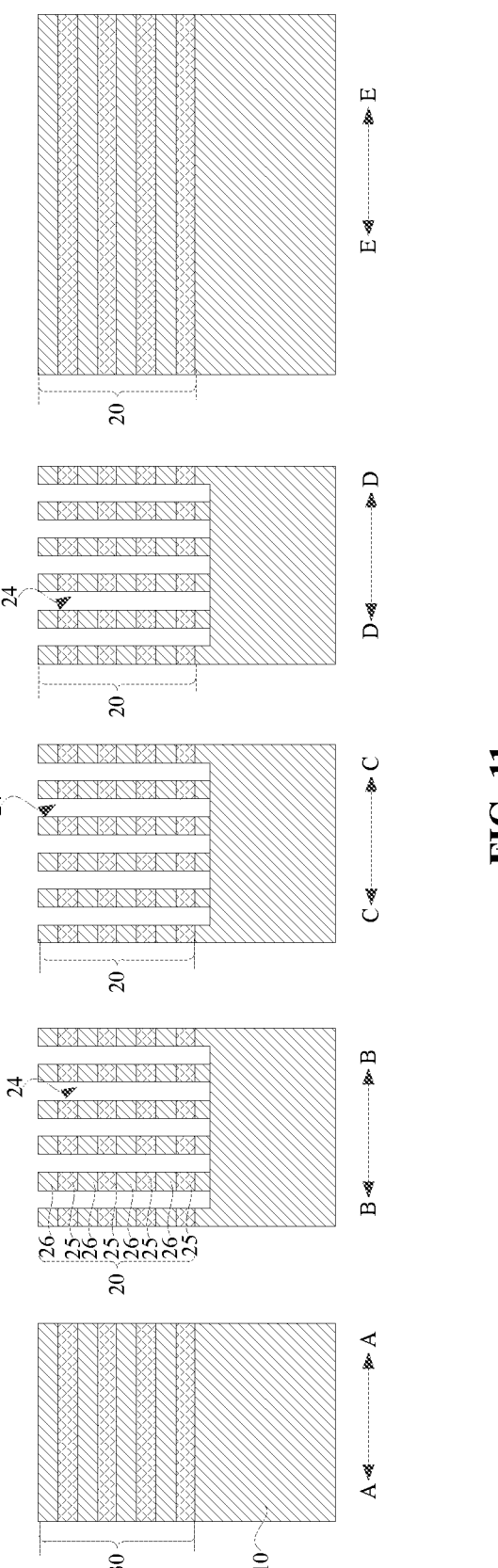
FIG. 11 shows cross-sectional views in A-A, B-B, C-C, D-D and E-E directions after forming a first trench in the method for manufacturing a memory provided by embodiments of the disclosure.

Next, referring to FIG. 11, taking the first mask layer 11 as a mask, part of the initial laminated structure 23 at the first region and the third region is removed to form a plurality of first trenches 24 at the first region and the third region, the plurality of first trenches 24 separate the initial laminated structure at the first region and the third region into columns of stacked structures 20; at the same time, the initial laminated structure 23 remaining on the second region constitutes the laminated structure 30.

Herein, each column of the stacked structure 20 includes a plurality of sacrificial layers 25 and a plurality of active layers 26 alternately stacked. The film layers of the laminated structure 30 is the same as the film layers of the stacked structure 20, which will not repeat in this embodiment. The material of the sacrificial layer 25 includes silicon oxide, but is not limited to.

In the embodiment, the first mask layer 11 may be a single film layer or a stacked structure. When the first mask layer 11 is a stacked structure, the accuracy of the mask pattern of the first mask layer 11 during the transfer process can be increased, thereby increasing the yield of the memory.

Figure 12:
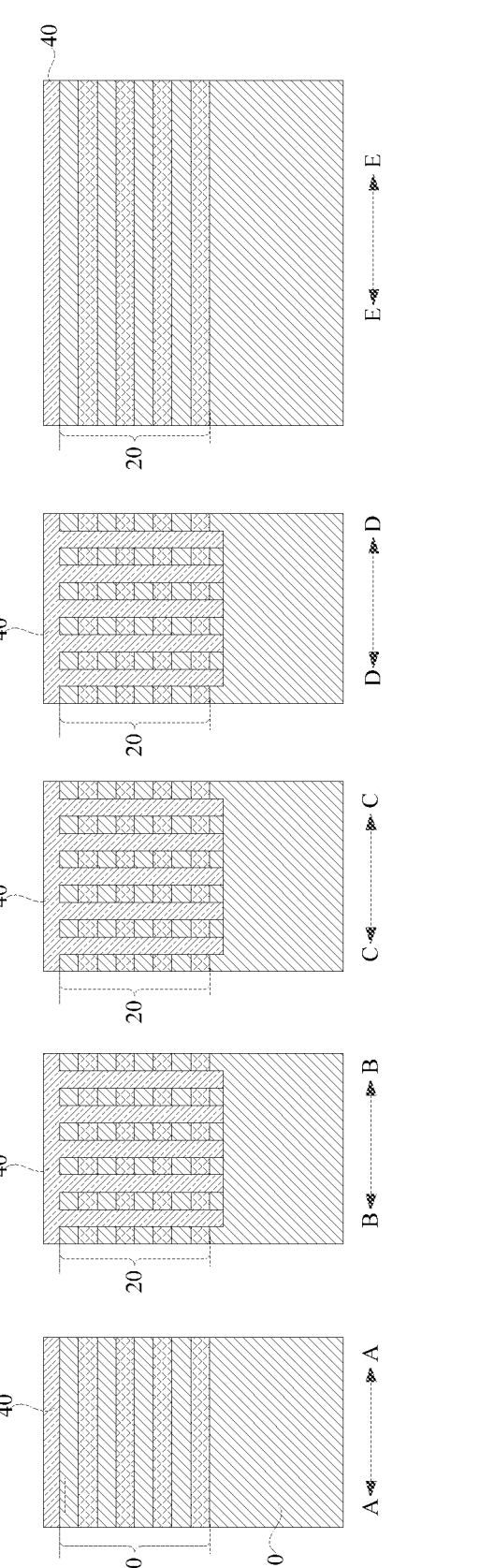
FIG. 12 shows cross-sectional views in A-A, B-B, C-C, D-D, and E-E directions after forming a second dielectric layer in the method for manufacturing a memory provided by embodiments of the disclosure.

In S220, part of the sacrificial layer located at the first region and the third region is removed to form second trenches in communication with the first trenches;

Referring to FIG. 12, a second dielectric layer 40 is deposited in the first trenches 24, and the second dielectric layer 40 extends outside the first trenches 24 and covers on the columns of the stacked structure 20 and the laminated structure 30.

For example, the second dielectric layer 40 is formed in the first trenches 24 by a process such as chemical vapor deposition (CVD), physical vapor deposition (PVD) or atomic layer deposition (ALD), or the like. The thickness direction of the second dielectric layer 40 is the same as the depth direction of the first trenches 24 and both are perpendicular to the substrate 10.

In the embodiment, the material of the second dielectric layer 40 includes silicon oxide, but is not limited to.

Figure 13:
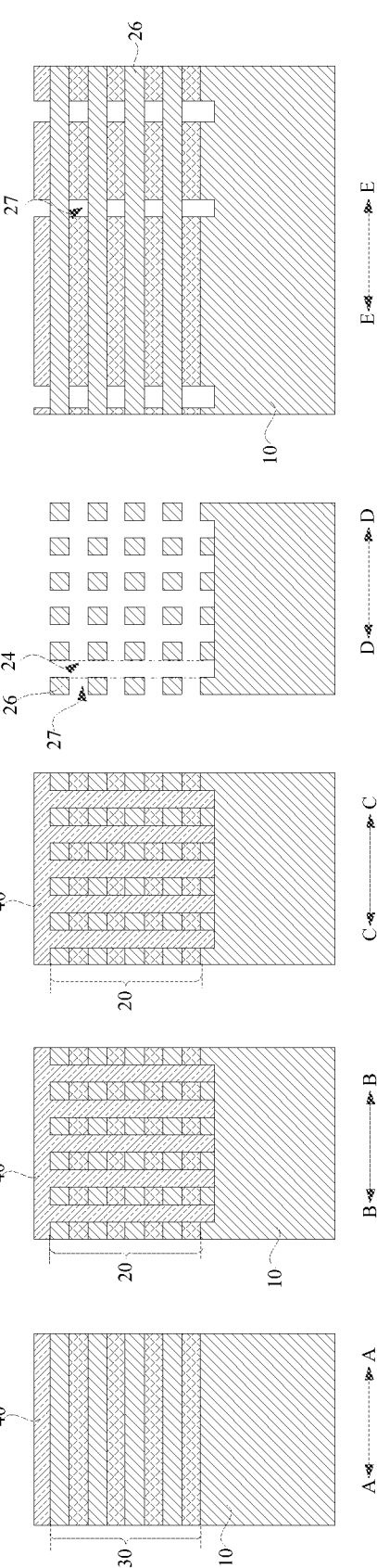
FIG. 13 shows cross-sectional views in A-A, B-B, C-C, D-D, and E-E directions after forming a second trench in the method for manufacturing a memory provided by embodiments of the disclosure.

Next, referring to FIG. 13, a second mask layer (not shown in the figure) having a mask pattern may be formed on the second dielectric layer 40, and part of the sacrificial layer 25 and the second dielectric layer 40 is removed by taking the second mask layer as a mask to expose part of the first trench 24 and the second trenches 27 communicating with the first trenches 24.

In S230, a support structure is formed in the first trenches and the second trenches, for supporting any adjacent active layers;

Referring to FIG. 14, an insulating material is deposited in the exposed first trenches 24 and second trenches 27 by a deposition process to form the support structure 50 for supporting any adjacent active layers 26; that is, the support structure 50 can support adjacent active layers 26 in a horizontal plane and also in a plane perpendicular to the substrate 10.

Figure 15:
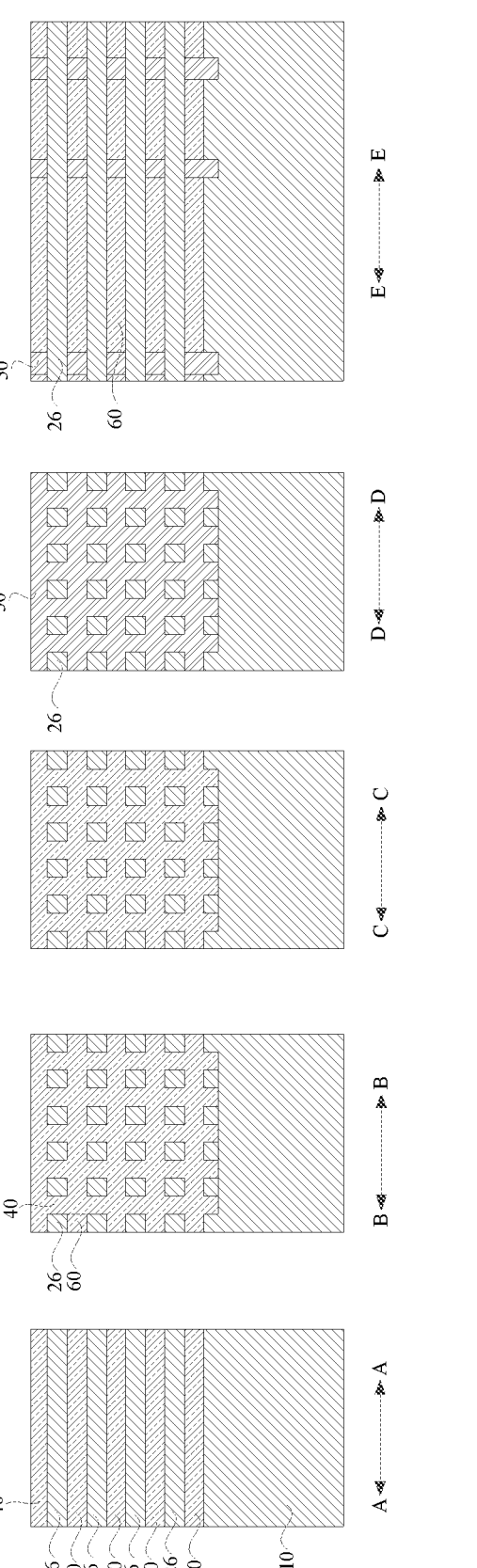
FIG. 15 shows cross-sectional views in A-A, B-B, C-C, D-D, and E-E directions after forming a first dielectric layer in the method for manufacturing a memory provided by embodiments of the disclosure.

In S240, the remaining part of the sacrificial layer is removed and a first dielectric layer is formed in a region where the remaining part of the sacrificial layer is located, the structure of which is shown in FIG. 15.

The first dielectric layer 60 may be deposited in the region where the remaining part of the sacrificial layer is located by a deposition process and the material of the first dielectric layer 60 includes silicon nitride, but is not limited to.

In S250, part of the first dielectric layer and part of the second dielectric layer in the first sub-region are removed to form a filling region, the filling region exposes part of the active layers, and the exposed part is used for forming a channel region of a transistor;

For example, referring to FIG. 16, part of the first dielectric layer 60 and the second dielectric layer 40 in the first sub-region may be removed by using an etching gas or an etching liquid to form a filling region 70, the filling region 70 exposes the channel region of the active layer 26 to facilitate subsequent formation of the gate oxide layer and the word line around the channel region.

In S260, a gate oxide layer and word lines are formed in the filling region, in which the word lines and the gate oxide layer surrounding the active layers form a transistor together with the active layers.

Referring to FIG. 17, the gate oxide layer 80 and the word lines 140 surrounding the active layers 26 located in the filling region 70 are formed in sequence by deposition. Herein, the gate oxide layer 80 has a high dielectric constant.

In S270, a capacitor is formed in the second sub-region, and the capacitor is connected with the transistor.

Figure 18:
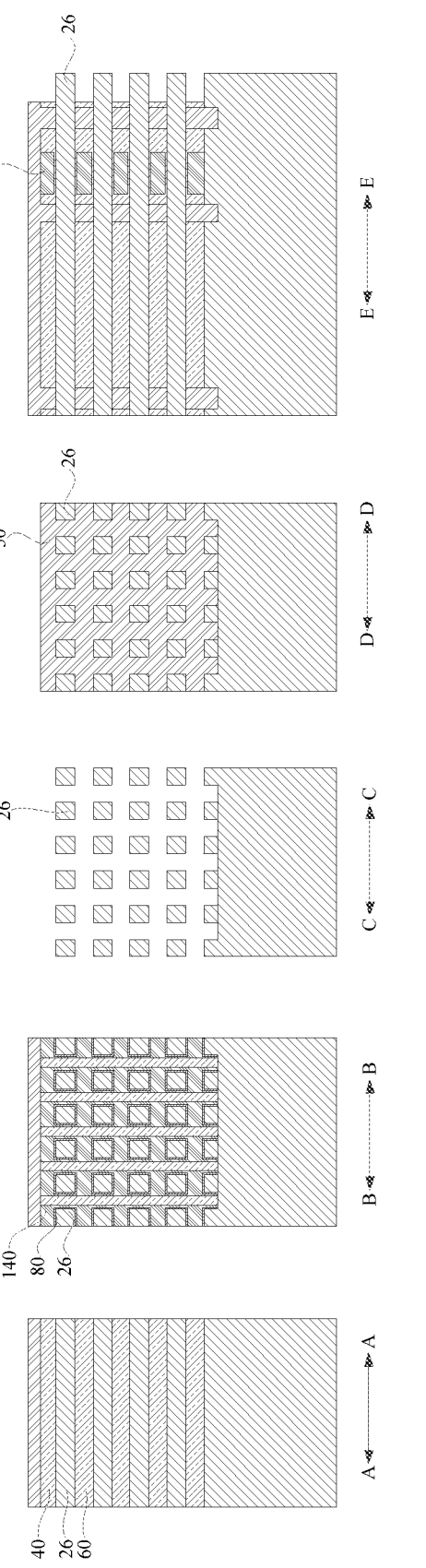
FIG. 18 shows cross-sectional views in A-A, B-B, C-C, D-D, and E-E directions after removing part of the first dielectric layer and the second dielectric layer in the method for manufacturing a memory provided by embodiments of the disclosure.

Referring to FIG. 18, part of the second dielectric layer 40 and part of the first dielectric layer 60 located at the second sub-region are removed by using an etching gas or an etching liquid to expose part of the surface of the active layer in the second sub-region.

Figure 19:
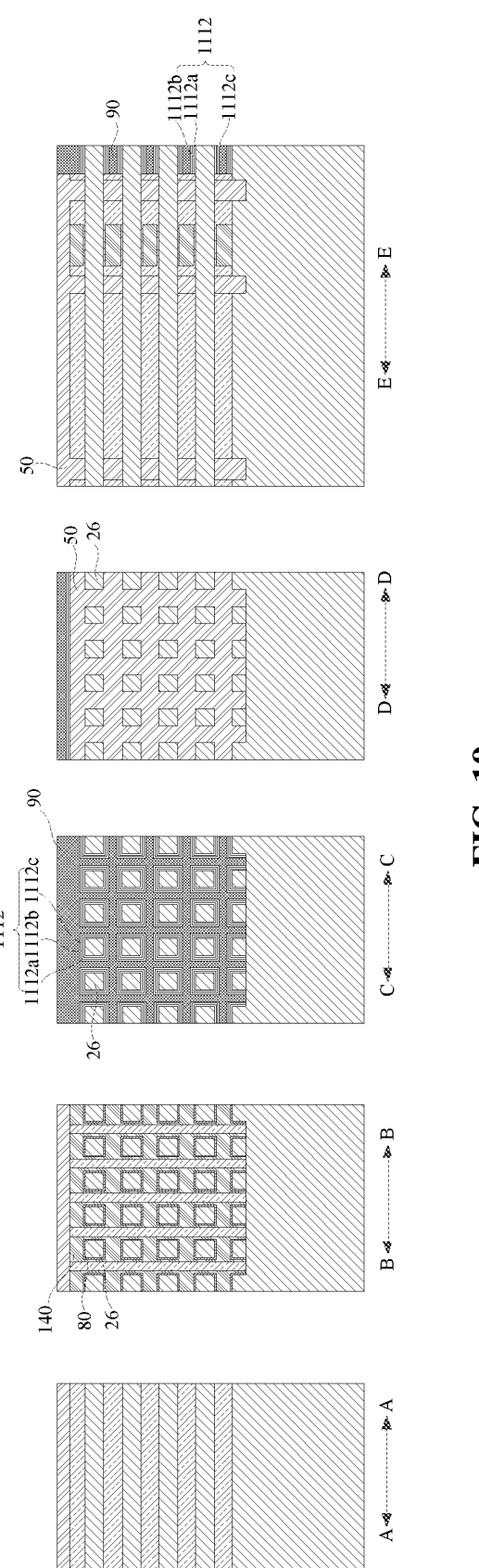
FIG. 19 shows cross-sectional views in A-A, B-B, C-C, D-D, and E-E directions after forming capacitors in the method for manufacturing a memory provided by embodiments of the disclosure.

Next, referring to FIG. 19, the capacitor 1112 is formed on the active layer exposed in the second sub-region by deposition, in which the capacitor includes a first electrode layer 1112a, a dielectric layer 1112b, and a second electrode layer, and the first electrode layer 1112a, the dielectric layer 1112b, and the second electrode layer 1112c sequentially surround the active layers 26 in the second sub-region.

Next, with continued reference to FIG. 19, an interconnection layer 90 is formed which fills between any adjacent capacitors and is connected to the second electrode layer 1112c of each capacitor 1112 to connect a plurality of capacitors 1112 together in parallel. Herein, the material of the sacrificial layer 90 includes polysilicon, but is not limited to.

Figure 20:
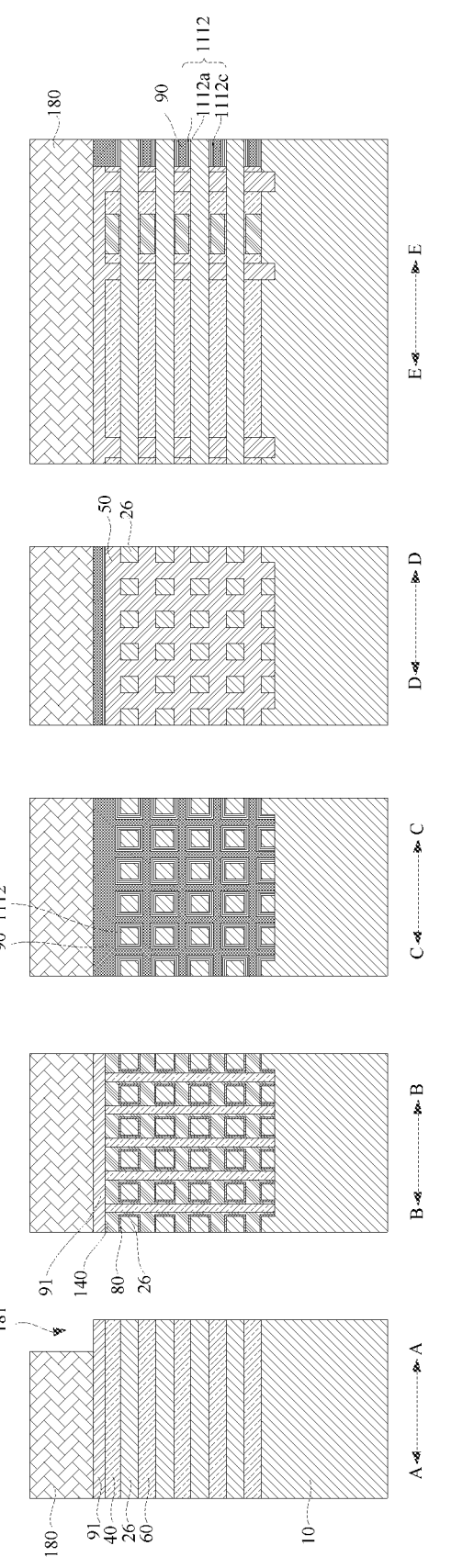
FIG. 20 shows cross-sectional views in A-A, B-B, C-C, D-D, and E-E directions after forming a first photoresist layer in the method for manufacturing a memory provided by embodiments of the disclosure.

Referring to FIG. 20, an insulating layer 91 is formed at the second region and the first sub-region, and the top surface of the insulating layer 91 is flush with the top surface of the interconnection layer 90. The insulating layer 91 plays isolation and protection roles.

In some embodiments, the operation of forming the bit line structure in the second region includes the following operations.

Referring to FIG. 21, part of the laminated structure is removed to form a groove in the laminated structure. The bottom of the groove is a top surface of the lowest active layer, one sidewall of the groove has step surfaces, and the active layers retained at the second region constitutes the bit line structure.

For example, with continued reference to FIG. 20 and FIG. 21, a first photoresist layer 180 having a first opening 181 is formed on the insulating layer 91 and the interconnection layer 90, part of the thickness of the film layer exposed by the first opening is removed, and a first groove is formed at the second region. The bottom of the first groove is the top surface of the lowest active layer 26, and the lowest active layer 26 serves as a first bit line 121. Herein, the first opening 181 exposes only the film layers in the second region.

It should be noted that FIG. 21 only differs from FIG. 20 in the cross-sectional view in A-A direction, and the reference numerals of the cross-sectional views in other directions can refer to FIG. 20.

Next, the first photoresist layer is removed and a second photoresist layer (not shown) with the second opening is reformed, the sidewalls of the second opening coincide with the sidewalls of the first groove.

Next, part of the thickness of the film layers exposed by the second opening is removed by an etching liquid or an etching gas, and a second groove is formed at the second region, the bottom of the second groove is the top surface of the active layer retained in the penultimate layer, so as to form the second bit line 121.

According to the above operations, a plurality of bit lines 121 are formed at the second region and the plurality of bit lines 121 form step surfaces from a bottom to a top.

Figure 22:
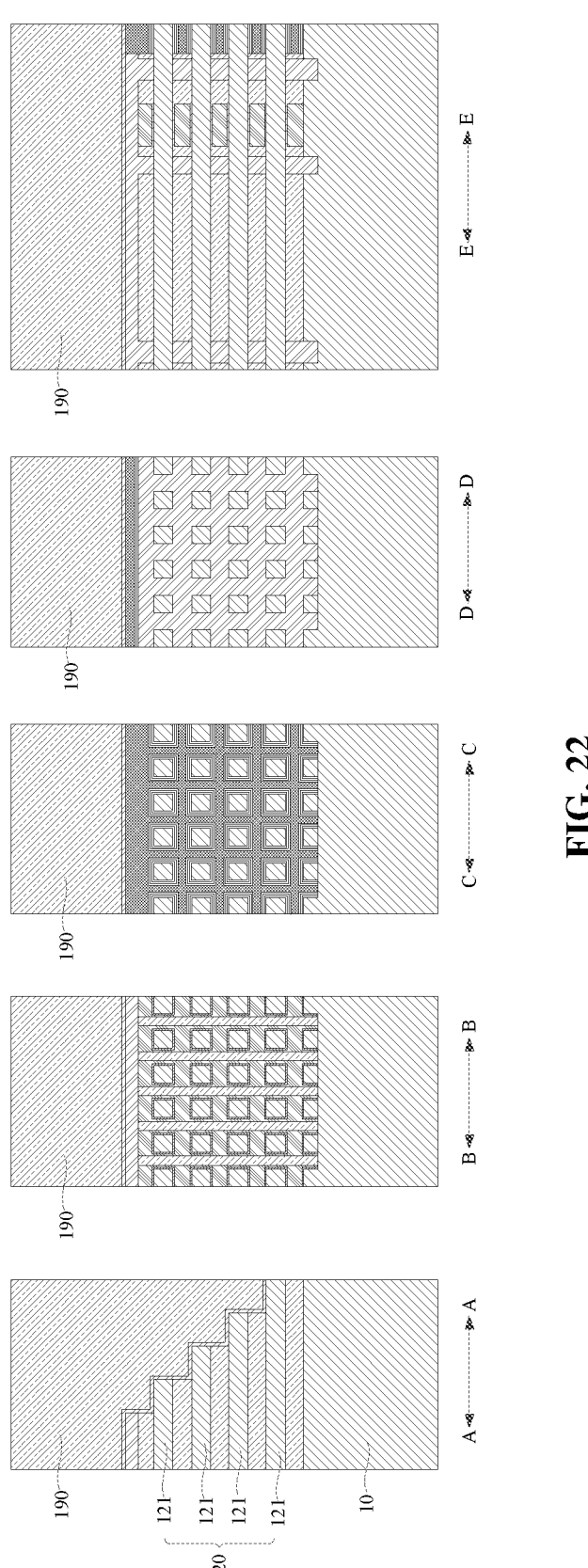
FIG. 22 shows cross-sectional views in A-A, B-B, C-C, D-D, and E-E directions after forming a third dielectric layer in the method for manufacturing a memory provided by embodiments of the disclosure.

Referring to FIG. 22, a third dielectric layer 190 is formed, which fills the groove and covers the insulating layer 91 and the interconnection layer 90.

Figure 24:
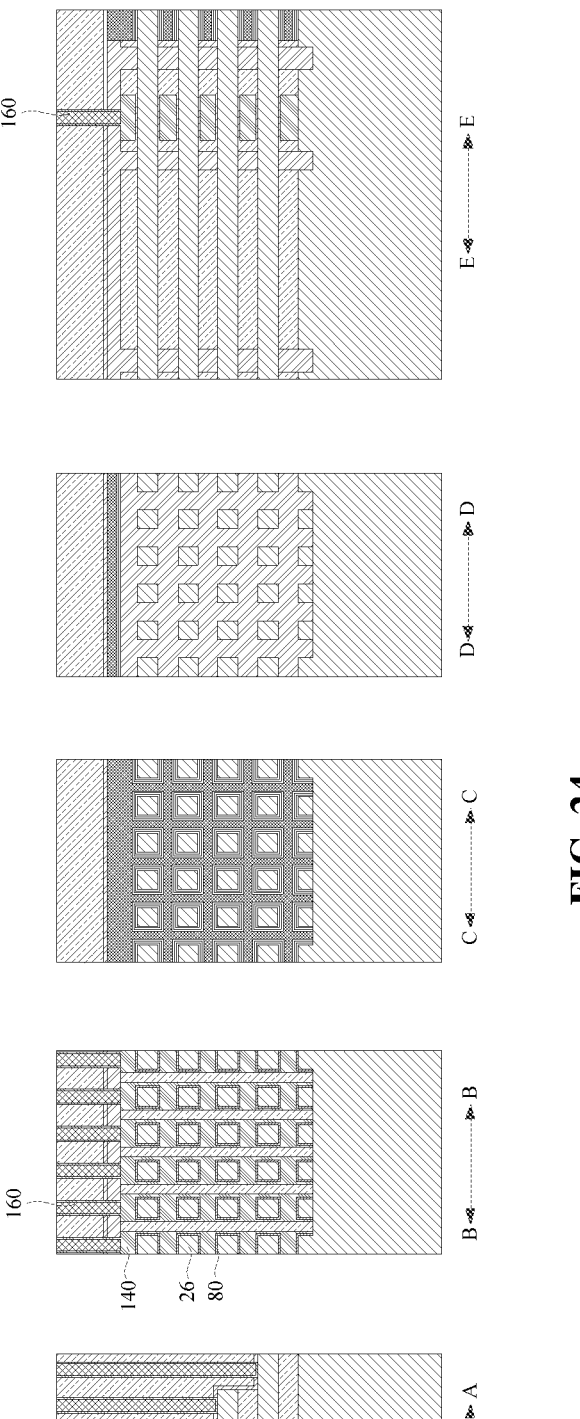
FIG. 24 shows cross-sectional views in A-A, B-B, C-C, D-D and E-E directions after forming a first data line, a second data line and a third data line in the method for manufacturing a memory provided by embodiments of the disclosure.

Referring to FIG. 23, the third dielectric layer 190 is patterned to form a plurality of filling holes 191 in the third dielectric layer 190, in which the bottoms of the filling holes 191 located at the first sub-region are the top surfaces of the word lines 140, the bottoms of the filling holes 191 located at the second sub-region are the top surface of the interconnection layer 90, and the bottoms of the filling holes 191 located at the second region the step surfaces;

Referring to FIG. 24, a conductive material is deposited in the filling holes to form the first data lines 150, the second data lines 160 and the third data line (not shown).

Various examples and embodiments in this specification are described in a progressive manner and each embodiment focuses on differences from other embodiments. Same and similar parts between the embodiments can be referred to each other.

In the description of the specification, the reference terms "one embodiment", "some embodiments", "illustrative embodiments", "example", "specific example", "some examples" or the like refer to that specific features, structures, materials, or characteristics described in connection with the embodiment or example are included in at least one embodiment or example of the disclosure.

In this specification, illustrative representations of the above terms do not necessarily refer to the same embodiments or examples. Further the described specific features, structures, materials or characteristics may be combined in a suitable manner in any one or more embodiments or examples.

Finally, it should be noted that, the above embodiments are only used to illustrate the technical solution of the present disclosure, not limitation; although the present disclosure has been described in detail with reference to the preceding embodiments, it should be understood by those of ordinary skill in the art that the technical solution described in the preceding embodiments can still be modified or some or all of the technical features thereof can be equivalently replaced; while these modifications or replacements are not intended to make the nature of the corresponding technical solution depart from the scope of the technical solution of the embodiments of the present disclosure.

What is claimed is:

1. A semiconductor structure comprising a plurality of memory groups provided in rows, each of the memory groups comprising a plurality of memories arranged at intervals along a row direction, wherein for two adjacent ones of the memory groups, the memories in one memory group and the memories in another memory group are staggered;

wherein each of the memories comprises two memory cell arrays and a bit line structure, and the two memory cell arrays are located at opposite sides of the bit line structure in the row direction; and wherein the bit line structure extends along a first direction and is electrically connected with transistors in the two memory cell arrays, one end of the bit line structure protrudes from the memory cell arrays and has step surfaces, and the protruding part of the bit line structure is located between adjacent memories in a memory group adjacent to the protruding part; and wherein the first direction and the row direction are perpendicular to each other and are located in a same horizontal plane.

2. The semiconductor structure according to claim 1, wherein each of the memory groups comprises a first sub-memory group and a second sub-memory group, the first sub-memory group and the second sub-memory group are arranged at intervals along the first direction, and the first sub-memory group and the second sub-memory group are arranged symmetrically with respect to the row direction.

3. The semiconductor structure according to claim 1, wherein a memory cell array comprises a plurality of memory cell layers, the plurality of memory cell layers are arranged at intervals along a second direction, for two adjacent ones of the memory cell layers, a projection of one memory cell layer on an other memory cell layer coincides with the other memory cell layer; and wherein the second direction, the first direction and the row direction are perpendicular to each other; and wherein each of the memory cell layers comprises a plurality of memory cells arranged at intervals along the first direction, and each of the memory cells comprises a transistor and a capacitor connected to the transistor.

4. The semiconductor structure according to claim 2, wherein a memory cell array comprises a plurality of memory cell layers, the plurality of memory cell layers are arranged at intervals along a second direction, for two adjacent ones of the memory cell layers, a projection of one memory cell layer on an other memory cell layer coincides with the other memory cell layer; and wherein the second direction, the first direction and the row direction are perpendicular to each other; and wherein each of the memory cell layers comprises a plurality of memory cells arranged at intervals along the first direction, and each of the memory cells comprises a transistor and a capacitor connected to the transistor.

5. The semiconductor structure according to claim 3, wherein each of the memory cells has a plurality of capacitors, the plurality of capacitors are arranged at intervals along the row direction, and the plurality of the capacitors are connected to each other by one electrode layer.

6. The semiconductor structure according to claim 5, wherein the bit line structure comprises a plurality of bit lines arranged at intervals along the second direction, each of the bit lines is connected with the transistors of all the memory cells in a memory cell layer located at a same layer, and an end of the transistor connected to a bit line is different from an end of the transistor connected to the capacitor.

7. The semiconductor structure according to claim 6, wherein each of the bit lines other than an uppermost bit line comprises a first segment and a second segment connected in sequence, and a width of the second segment is shorter than a width of the first segment; and wherein at least part of the second segment is located between adjacent memories in the memory group adjacent to the second segment.

8. The semiconductor structure according to claim 7, wherein a memory further comprises a word line structure comprising a plurality of word lines arranged at intervals along the first direction, and each of the word lines extends along the second direction.

9. The semiconductor structure according to claim 8, further comprising first data lines, second data lines and a third data line;

wherein the first data lines are connected with the bit line structure; and wherein a second data line is connected to a word line, and the third data line is connected to the capacitor of the memory.

10. A method for manufacturing a memory in the semiconductor structure according to claim 1, comprising:

providing a substrate having a first region, a second region and a third region, the first region and the third region being symmetrically arranged at two sides of the second region;

forming the two memory cell arrays in the first region and the third region, respectively; and forming the bit line structure in the second region, and the bit line structure being electrically connected with the transistors in the two memory cell arrays; wherein the one end of the bit line structure protrudes from the memory cell arrays and has the step surfaces.

11. The method according to claim 10, wherein the first region comprises a first sub-region and a second sub-region connected to each other, the first sub-region is used for forming a transistor and the second sub-region is used for forming a capacitor;

wherein the forming the two memory cell arrays in the first region and the third region, respectively comprises:

forming columns of stacked structures arranged at intervals along the first direction in the first region and the third region, and a first trench being formed between two adjacent ones of the columns of the stacked structures; and forming a laminated structure in the second region; wherein each of the columns of the stacked structures comprises a plurality of sacrificial layers and a plurality of active layers alternately stacked, and film layers of the laminated structure are same as film layers of a stacked structure;

forming a second dielectric layer in first trenches, the second dielectric layer extending outside the first trenches and covering top surfaces of the columns of the stacked structures;

removing part of a sacrificial layer located at the first region and the third region to form a second trench in communication with the first trench;

forming a support structure in the first trenches and second trenches to support any adjacent active layers;

removing a remaining sacrificial layer and forming a first dielectric layer in a region where the remaining sacrificial layer is located;

removing part of the first dielectric layer and part of the second dielectric layer in the first sub-region to form a filling region, the filling region exposing part of an active layer, and the exposed part being used for forming a channel region of the transistor;

forming a gate oxide layer and word lines in the filling region, wherein the word lines and the gate oxide layer surrounding the active layers together with the active layers constitute the transistor; and forming the capacitor being connected with the transistor in the second sub-region.

12. The method according to claim 11, wherein the capacitor comprises a first electrode layer, a dielectric layer and a second electrode layer; and the first electrode layer, the dielectric layer and the second electrode layer sequentially surrounds the active layers in the second sub-region.

13. The method according to claim 11, wherein after forming the capacitor being connected with the transistor in the second sub-region, the method further comprises:

forming an interconnection layer, the interconnection layer filling between any adjacent capacitors and being connected to the second electrode layer of each one of the capacitors; and forming an insulating layer on the second region and the first sub-region, a top surface of the insulating layer being flush with a top surface of the interconnection layer.

14. The method according to claim 13, wherein the forming the bit line structure in the second region comprises:

removing part of the laminated structure to form a groove in the laminated structure, a bottom of the groove being a top surface of a lowest active layer, one sidewall of the groove having the step surfaces, and the active layers retained on the second region constituting the bit line structure.

15. The method according to claim 14, wherein after forming the bit line structure in the second region, the method further comprises:

forming a third dielectric layer filling the groove and covering the insulating layer and the interconnection layer;

patterning the third dielectric layer to form a plurality of filling holes in the third dielectric layer, wherein bottoms of the filling holes in the first sub-region are top surfaces of the word lines, bottoms of the filling holes in the second sub-region are the top surface of the interconnection layer, and bottoms of the filling holes in the second region are the step surfaces; and depositing a conductive material in the filling holes to form first data lines, second data lines and a third data line.

* * * * *